United States Patent
Altolaguirre et al.

(10) Patent No.: US 10,147,717 B2
(45) Date of Patent: Dec. 4, 2018

(54) ELECTROSTATIC DISCHARGE PROTECTION CIRCUIT

(71) Applicant: Novatek Microelectronics Corp., Hsinchu (TW)

(72) Inventors: Federico Agustin Altolaguirre, Hsinchu County (TW); Ming-Dou Ker, Hsinchu County (TW); Tzu-Chien Tzeng, Hsinchu (TW); Ju-Lin Huang, Hsinchu County (TW)

(73) Assignee: Novatek Microelectronics Corp., Hsinchu (TW)

( * ) Notice: Subject to any disclaimer, the term of this patent is extended or adjusted under 35 U.S.C. 154(b) by 279 days.

(21) Appl. No.: 15/247,943

(22) Filed: Aug. 26, 2016

(65) Prior Publication Data

US 2017/0069618 A1 Mar. 9, 2017

Related U.S. Application Data

(60) Provisional application No. 62/213,641, filed on Sep. 3, 2015.

(51) Int. Cl.
*H01L 27/02* (2006.01)
*H02H 9/04* (2006.01)
*H01L 27/06* (2006.01)

(52) U.S. Cl.
CPC ...... *H01L 27/0262* (2013.01); *H01L 27/0292* (2013.01); *H01L 27/0635* (2013.01); *H02H 9/046* (2013.01)

(58) Field of Classification Search
CPC ............. H01L 27/0262; H01L 27/0292; H01L 27/0635; H02H 9/046
See application file for complete search history.

(56) References Cited

U.S. PATENT DOCUMENTS 6,258,634 B1 * 7/2001 Wang ............... H01L 27/0262
148/335
7,825,429 B2 11/2010 Vinson
(Continued)

OTHER PUBLICATIONS

Ming-Dou Ker, "Whole-Chip ESD Protection Design with Efficient VDD-to-VSS ESD Clamp Circuits for Submicron CMOS VLSI," IEEE Transactions on Electron Devices, Jan. 1999, pp. 173-183.
(Continued)

*Primary Examiner* — Zeev V Kitov
(74) *Attorney, Agent, or Firm* — JCIPRNET (57) ABSTRACT

In the disclosure, an electrostatic discharge (ESD) protection circuit is coupled between a first power rail and a second power rail to discharge any ESD stress. The ESD protection circuit includes a detection circuit, a triggering circuit, and a dual silicon controlled rectifier (DSCR) device. When an ESD stresses is being applied to the first or second power rail, the detection circuit may first detect the ESD stresses and output a detection signal to the triggering circuit. The triggering circuit generates a triggering signal based on the detection signal and the polarity of the ESD stress. Then, the DSCR device is symmetrically triggered based on the triggering signal received at a common node between at least two transistors of the same type. The exemplary ESD protection circuit may be implemented in nanoscale manufactured integrated circuit and achieve good ESD robustness while maintaining low standby leakage current and relatively small silicon footprint.

14 Claims, 8 Drawing Sheets

(56) References Cited

U.S. PATENT DOCUMENTS

| | | | | |
|---|---|---|---|---|
| 9,478,608 B2* | 10/2016 | Salcedo | ............. | H01L 29/0646 |
| 2012/0199874 A1* | 8/2012 | Salcedo | ............. | H01L 27/0262 |
| | | | | 257/120 |
| 2014/0319648 A1* | 10/2014 | Fenouillet-Beranger | ................... | |
| | | | | H01L 27/0259 |
| | | | | 257/526 |

OTHER PUBLICATIONS

Ker et al.,"Design on the low-leakage diode string for using in the power-rail ESD clamp circuits in a 0.35-µm silicide CMOS process," IEEE transactions on Solid-State Circuits, Apr. 2000, pp. 601-611.

Altolaguirre et al., "Low-Leakage Bi-Directional SCR with Symmetrical Trigger Circuit for ESD Protection in 40-nm CMOS Process," IEEE Transactions on Device and Materials Reliability, Aug. 15, 2016, pp. 1-7.

* cited by examiner

ELECTROSTATIC DISCHARGE PROTECTION CIRCUIT

CROSS-REFERENCE TO RELATED APPLICATION

This application claims the priority benefits of U.S. provisional application Ser. No. 62/213,641, filed on Sep. 3, 2015. The entirety of the above-mentioned patent application is hereby incorporated by reference herein and made a part of this specification.

BACKGROUND OF THE INVENTION

Field of Invention

The invention relates to electrostatic discharge (ESD) protection. Particularly, the invention relates to an ESD protection circuit discharging ESD stress from power rails.

Description of Related Art

In the field of integrated circuit (IC), electrostatic discharge (ESD) protection is an important task on the reliability of the ICs, where a proper ESD protection is needed to discharge any ESD stresses to protect internal circuits from being damaged. Generally, the ESD stresses may occur between pins (pin-to-pin ESD stress), one power rail to another power rail (e.g., VDD-to-VSS ESD stress, VSS-to-VDD ESD stress or domain-to-domain ESD stress).

In the advanced IC technology, ICs are designed to have at least two power domains, for example, one for analog circuits and another for digital circuits, different voltage levels for different digital circuits, etc. In the multiple power domain scheme, extra ESD protection elements are required across the power domains (domain-to-domain protection), as every pin-to-pin ESD combination must be protected.

Conventionally, a silicon controlled rectifier (SCR) or a metal-oxide semiconductor (MOS) transistor is used as ESD clamps to direct and conduct the ESD current properly. However, as both the SCR and the MOS transistor can only operate with a fixed polarity due to the parasitic diodes in their structure, thus they cannot be used for the domain-to-domain ESD protection.

Another commonly used ESD protection element is an antiparallel diode string. The number of diodes on each string may be selected according the voltages on each node in order to avoid conduction under normal circuit operation. However, the antiparallel diodes require large silicon footprint area, especially if the required voltage drop is too large. The diode string is also known to suffer from large leakage current in the nanoscale IC manufacturing processes.

To meet the requirement of conducting the ESD stresses in both directions, another symmetrical device, a dual-SCR (DSCR) device is utilized, which requires smaller silicon footprint than the antiparallel diodes for the same ESD protection level. However, the DSCR device requires the addition of a fully symmetrical triggering circuit. For example, in a ground-to-ground ESD clamp 100 shown in FIG. 1 of the U.S. Pat. No. 7,825,429, trigger elements 114 and 116 integrated by diode strings 110 (1-N) and 112 (1-N) have been utilized to set the trigger voltage of each side of the DSCR device, made of transistors 102, 104, 106 and resistors 108 and 110, at which each diode strings will conduct current and trigger the DSCR device. However, diode strings are known to have a relatively large leakage current in the nanoscale IC manufacturing processes and requires large footprint.

SUMMARY OF THE INVENTION

In the disclosure, an electrostatic discharge (ESD) protection circuit is provided. The ESD protection circuit includes a detection circuit, a triggering circuit and a dual-directional silicon controlled rectifier (DSCR) device. The detection circuit is coupled between a first power rail and a second power rail for detecting an ESD stress from the first power rail or the second power rail and outputting a detection signal according to the ESD stress. The triggering circuit is coupled to the detection circuit for receiving the detection signal and outputting a triggering signal according to the detection signal. In addition, the DSCR device includes a first terminal coupled to the first power rail, a second terminal coupled to the second power rail, a third temal coupled to the triggering circuit to receive the triggering signal, and at least two transistors of a first type (a first transistor and a second transistor). The DSCR device is configured to discharge the ESD stress according to the triggering signal, wherein the third terminal is coupled to a common node between at least two transistors of the first type. The DSCR device further includes a third transistor of a second type, having a base terminal coupled to the common node, a first terminal coupled to the base terminal of the second transistor of the first type, and a second terminal coupled to the base of the first transistor of the first type.

According to one of the embodiment, the first transistor is formed by a first region of a second doping type disposed in a first well of a first doping type, the first well of the first doping type, and a third well of the second doping type. The second transistor is formed by a second region of the second doping type disposed in a second well of the first doping type, the second well of the first doping type, and the third well of the second doping type. In addition, the third transistor is formed by the first well of the first doping type, the third well of the second doping type disposed between the first well of the first doping type and the second well of the first doping type, and the second well of the first doping type, wherein the common node of the first transistor, the second transistor and the third transistor is formed by the third well.

According to one of the embodiments of the disclosure, the ESD protection circuit of further includes a fourth diode coupled between the first power rail and the detection circuit, and a fifth diode coupled between the second power rail and the detection circuit.

According to one of the embodiments of the disclosure, the triggering circuit includes a fourth transistor and a fifth transistor. The fourth transistor includes a first terminal coupled to the first power rail, a second terminal coupled to the third terminal of the DSCR device, and a control terminal coupled to the detection circuit. The fifth transistor includes a first terminal coupled to the second power rail, a second terminal coupled to the second terminal of the fourth transistor, and a control terminal coupled to the detection circuit.

According to one of the embodiments of the disclosure, the triggering circuit further includes a first diode and a second diode coupled between the fourth and fifth transistors.

According to one of the embodiments of the disclosure, the detection circuit includes a first resistor, a second resistor, and a first capacitor. The first resistor is coupled between the first power rail and the control terminal of the fourth transistor of the triggering circuit. The second resistor is coupled between the second power rail and the control terminal of the fifth transistor of the triggering circuit. In addition, the first capacitor is coupled between the first resistor and the second resistor.

According to one of the embodiments of the disclosure, the detection circuit includes a first resistor, a second resistor, and an anti-parallel diode string. The first resistor, coupled between the first power rail and the control terminal of the fourth transistor of the triggering circuit. The second resistor, coupled between the second power rail and the control terminal of the fifth transistor of the triggering circuit. The anti-parallel diode string, coupled between the first resistor and the second resistor.

The disclosure provides an ESD protection circuit coupled between a first power rail or a second power rail, which effectively discharges any ESD stress occurred on the first or second power rail. The ESD protection circuit utilizes a dual silicon controlled rectifier (DSCR) device with a triggering circuit that symmetrically triggers the DSCR device in response to polarities of the ESD stress. The exemplary ESD protection circuit may be implemented in nanoscale manufactured integrated circuit and achieve good ESD robustness while maintaining low standby leakage current and relatively small silicon footprint.

In order to make the aforementioned and other features and advantages of the disclosure more comprehensible, embodiments accompanying figures are described in detail below.

It should be understood, however, that this summary may not contain all of the aspect and embodiments of the present disclosure and is therefore not meant to be limiting or restrictive in any manner. Also the present disclosure would include improvements and modifications which are obvious to one skilled in the art.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Reference will now be made in detail to the present embodiments of the disclosure, examples of which are illustrated in the accompanying drawings. Wherever possible, the same reference numbers are used in the drawings and the description to refer to the same or like parts.

No element, act, or instruction used in the detailed description of disclosed embodiments of the present application should be construed as absolutely critical or essential to the present disclosure unless explicitly described as such. Also, as used herein, the singular forms "a," "an" and "the" are intended to include the plural forms as well, unless the context clearly indicates otherwise. Furthermore, when an element is referred to as being "connected" or "coupled" to another element, it may be directly connected or coupled to the other element or intervening elements may be presented.

Embodiments of the disclosure provide an electrostatic discharge (ESD) protection circuit utilizing a dual silicon controlled rectifier (DSCR) device that is symmetrically triggered by a triggering circuit. The exemplary ESD protection circuit may be implemented in nanoscale manufactured integrated circuit and achieve good ESD robustness while maintaining low standby leakage current and relatively small silicon footprint.

Figure 1:
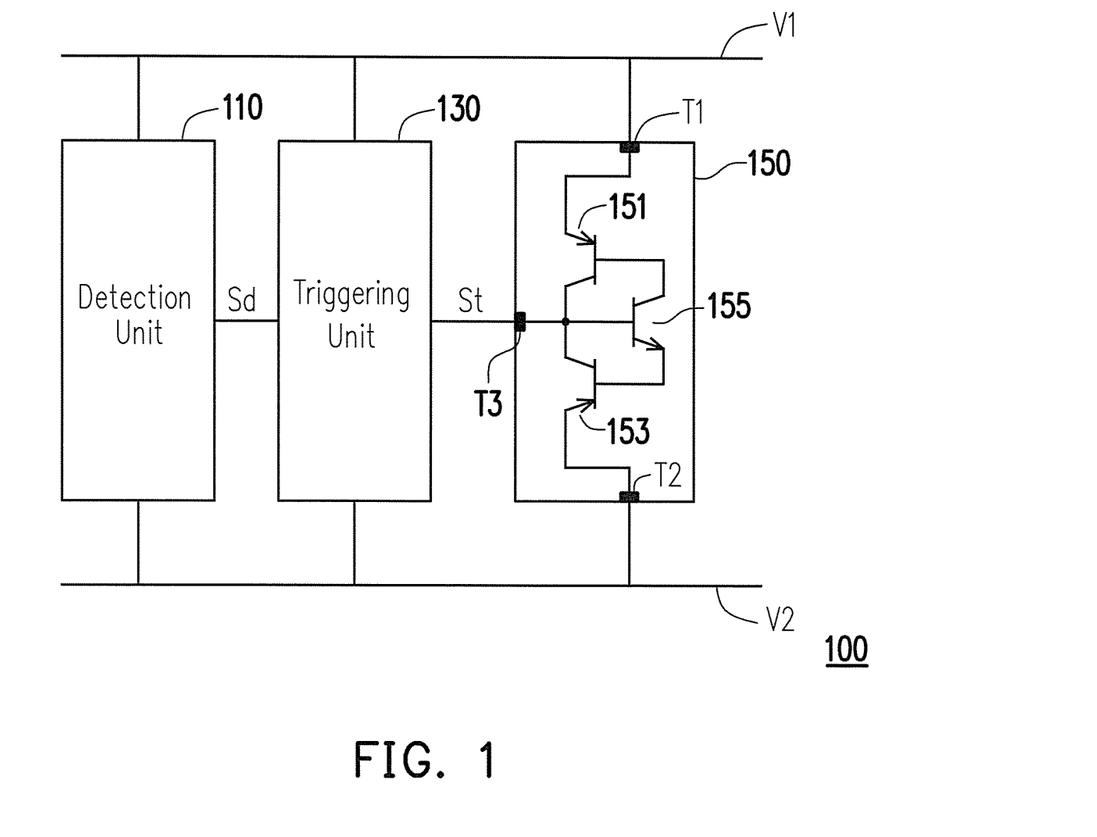
FIG. 1 is a diagram illustrating an electrostatic discharge (ESD) protection circuit according to one of the embodiments of the disclosure.

FIG. 1 is a diagram illustrating an ESD protection circuit 100 according to one of the embodiments of the disclosure. With reference to FIG. 1, the ESD protection circuit 100 is coupled between a first power rail $V_1$ and a second power rail $V_2$ providing a path to discharge any ESD stresses. In the embodiment, the ESD protection circuit 100 includes a detection circuit 110, a triggering circuit 130, and a DSCR device 150.

The detection circuit 110 is coupled between the first power rail V1 and the second power rail V2 as to detect an ESD stress from either the first power rail V1 or the second power rail V2, where polarity of the ESD stress may be negative or positive. Then, the detection circuit 110 outputs a detection signal Sd according to the detected ESD stress.

The triggering circuit 130 is coupled to the detection circuit 110 to receive the detection signal Sd generated based on the ESD stress being applied to the first or second power rails V1, V2. Upon the detection of the ESD stress, i.e., based on the detection signal Sd, the triggering circuit 130 outputs a triggering signal St (e.g., a triggering current) to control the DSCR device 150. The DSCR device 150 is then enabled to discharge the ESD stress being applied to the first and/or second power rails V1, V2.

The DSCR device 150 has a first terminal T1 coupled to the first power rail V1, a second terminal T2 coupled to the second power rail V2, and a third terminal T3 coupled to the triggering circuit 130. In detail, the DSCR device 150 includes at least two transistors of the same type connected in series between the first and second power rails V1, V2, and the third terminal T3 is coupled to a node commonly jointed by the transistors of the same type (also referred to as a triggering node). One end of the transistors of the same type is coupled to the first power rail V1, and another end of the transistors of the same type is coupled to the second power rail V2.

In the present embodiment, the DSCR device 150 includes the at least two transistors of the same type described above, e.g., a first transistor 151, a second transistor 153, and a third transistor 155 that has a type different from the first and second transistors 151, 153. In the example of FIG. 1, the DSCR device 150 is a N-well based DSCR (nDSCR) device, and the first transistor 151, the second transistor 153, and the third transistor 155 may be bipolar junction transistors (BJT), where the first and second transistors 151, 153 may be PNP BJT and the third transistor 155 may be NPN BJT.

The structure of the DSCR device 150 would be described in detail below. The first transistor 151 of the DSCR device 150 has a base terminal, a first terminal and a second terminal. The first terminal (emitter) of the first transistor 151 is coupled to the first power rail V1 through the first terminal T1 of the DSCR device 150. The second transistor 153 of the DSCR device 150 has a base terminal, a first terminal and a second terminal. The first terminal (emitter) of the second transistor 153 is coupled to the second power rail V2 through the second terminal T2 of the DSCR device 150. The second terminals (collector) of the first transistor 151 and the second terminal (collector) of the second transistor 153 are connected together forming the triggering node, which is coupled to the third terminal T3 of the DSCR device 150 and to receive the triggering signal St that triggers the operation of the DSCR device 150.

The third transistor 155 of the DSCR device 150, which is different from the first and second transistors 151, 153 in transistor type, is a NPN BJT and has a base terminal, a first terminal and a second terminal. The first terminal (emitter or collector) of the third transistor 155 is connected to the base terminal of the second transistor 153. The second terminal (collector or emitter) of the third transistor 155 is connected to the base terminal of the first transistor 151. In addition, the base terminal of the third transistor 155 is connected to the triggering node commonly joint by the first and second transistors 151, 153. It should be noted that the base and emitter terminals of the first transistor 151 are short-circuited (not shown in FIG. 1) in a metal layer, and there is a resistor foamed in an N-well region between the base and emitter terminals of the first transistor 151. Similarly, the base and emitter terminals of the second transistor 153 are short-circuited (not shown in FIG. 1) in the metal layer, and there is a resistor formed in the other N-well region between the base and emitter terminals of the second transistor 153. These transistors formed in the well regions are not illustrated in FIG. 1. This relationship would become more comprehensive at the illustration of the structure of the DSCR device later.

In the preset embodiment, when the ESD stress is being applied to the first power rail V1 (or the second power rail V2), the detection circuit 110 would detect the ESD stress and output the detection signal Sd to the triggering circuit 130; then, the triggering circuit 130 outputs the triggering signal St to the triggering node of the DSCR device 150 according to the detection signal Sd. Based on the ESD stress and the triggering signal, the DSCR device 150 can discharge the ESD stress.

Figure 2A:
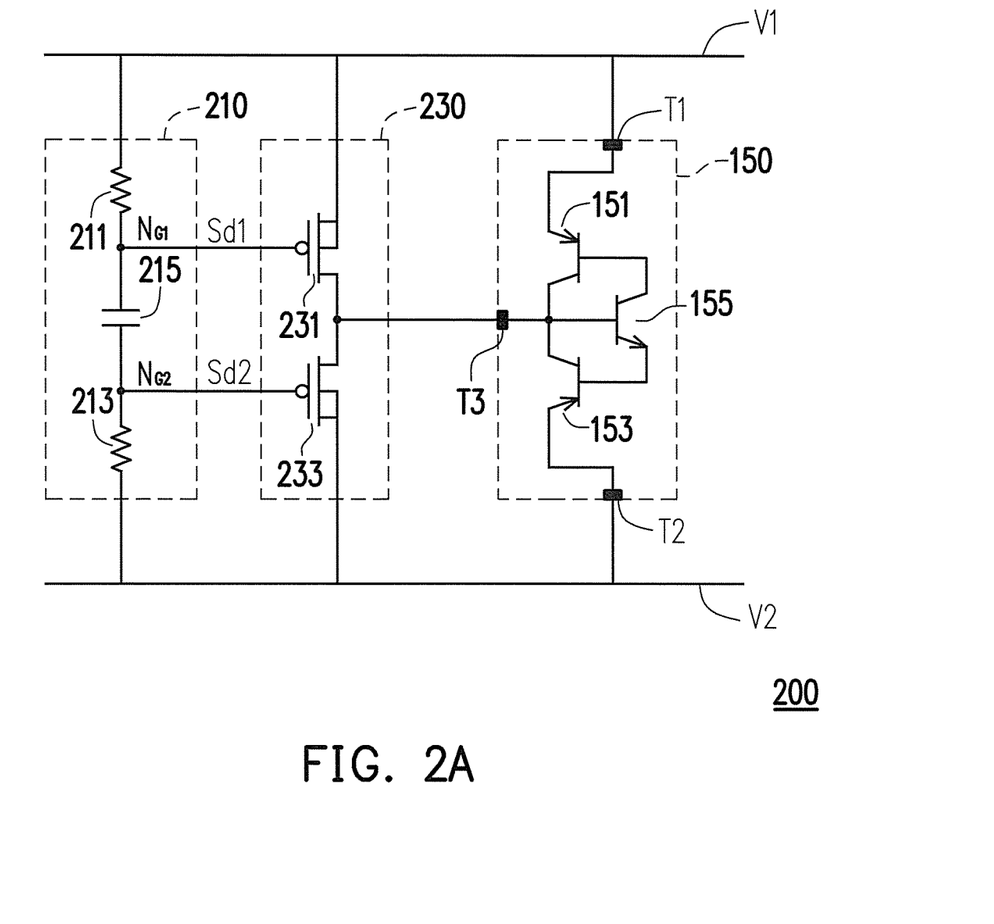
FIG. 2A is an equivalent circuit diagram illustrating an ESD protection circuit according to one of the embodiments of the disclosure.

FIG. 2A is an equivalent circuit diagram illustrating an ESD protection circuit 200 according to one of the embodiments of the disclosure. With reference to FIG. 2A, the ESD protection circuit 200 includes a detection circuit 210, a triggering circuit 230, and the DSCR device 150.

In the embodiment, the detection circuit 210 includes a first resistor 211, a second resistor 213, and a capacitor 215, where the first resistor 211, and the capacitor 215, and the second resistor 213 are connected in series forming a RCR (resistor-capacitor-resistor) network and coupled between the first and second power rails V1, V2. The capacitor 215 is coupled to the first power rail V1 through the first resistor 211 and to the second power rail V2 through the second resistor 213. A common node $N_{G1}$ commonly jointed by the first resistor 211 and the capacitor 215 (also referred to as a first node) is coupled to the triggering circuit 230, and the other common node $N_{G2}$ commonly jointed by the second resistor 213 and the capacitor 215 (also referred to as a second node) is also coupled to the triggering circuit 230.

The triggering circuit 230 includes a first transistor 231 and a second transistor 233. The first transistor 231 and the second transistor 233 are connected in series and coupled between the first power rail V1 and the second power rail V2. In the embodiment, the first transistor 231 and the second transistor 233 may be p-type, such as p-type metal-oxide semiconductor (MOS) transistors.

In detail, a first terminal (source) of the first transistor 231 is coupled to the first power ail V1, and a control terminal (gate) of the first transistor 231 is coupled to the common node $N_{G1}$ of the detection circuit 210. On the other end, a first terminal (source) of the second transistor 233 is coupled to the second power rail V2, and a control terminal (gate) of the second transistor 233 is coupled to the common node $N_{G2}$ of the detection circuit 210. The detection circuit 210 generates a first detection signal Sd1 and a second detection signal Sd2 as gate voltages for the first transistor 231 and the second transistor 233, when a ESD stress occurs on the rail V1 or V2. The second terminal (drain) of the first transistor 231 and the second terminal (drain) of the second transistor 233 are coupled to the triggering node (or said third terminal T3) of the DSCR device 150.

In the normal circuit operation, there is no current through the R-C-R path of the detection unit 210 and there is no voltage drop across the first resistor 211 or the second resistor 213, so that the p-type transistors 231 and 233 have $V_{SG}=0V$. In such a condition, the detection circuit 210 would keep the first and second transistors 231, 233 of the triggering circuit 230 off, and as a result, no current flows through any of the first transistor 231 and the second transistor 233 and no triggering current would be provided to the triggering node of the DSCR device 150.

Different from the normal circuit operation, when the ESD stress is applied to the first or second power rail V1, V2, the detection circuit 210 would turn on the appropriate transistor of the triggering circuit 230 to trigger the DSCR device 150. For example, when a positive ESD stress $V_{ESD}$ is applied to the first power rail V1, an ESD current would flow from the first power rail V1 to the second power rail V2. Initially, the initial voltages at the first node $N_{G1}$ and the second node $N_{G2}$ of the detection circuit 210 are approximate to a half of the ESD voltage ($V_{ESD}/2$), and the voltage across the capacitor 215 is initially 0V. With the ESD current flowing, the capacitor 215 would be charged through the first resistor 211 with a time constant equal to 2RC, and the voltage of the first node $N_{G1}$ increases exponentially and the voltage of the second node $N_{G2}$ decreases exponentially. The voltage drop $V_{SG1}$ across the first resistor 211 is positive and would turn on the first transistor 231 of the triggering circuit 230, such that the first transistor 231 conduct a current (i.e., the triggering signal St) to trigger the DSCR device 150. At the same time, the voltage drop $V_{SG2}$ across the second resistor 211 is negative and would not be in condition to turn on the second transistor 233, and thus the second transistor 233 would be off.

Similarly, when a positive ESD stress is applied to the second power rail V2, the initial voltages at the first node $N_{G1}$ and the second node $N_{G2}$ of the detection circuit 210 are approximate to a half of the ESD voltage ($V_{ESD}/2$), and the voltage across the capacitor 215 is initially 0V. With the ESD current flowing, the capacitor 215 would be charged and the voltage of the second node $N_{G2}$ increases exponentially and the voltage of the first node $N_{G1}$ decreases exponentially. The voltage drop $V_{SG2}$ across the second resistor 213 is positive and would turn on the second transistor 233 to conduct a current to trigger the DSCR device 150. At the same time, the voltage drop $V_{SG1}$ across the first resistor 211 is negative and would not turn on the first transistor 231.

In the case of negative ESD stress, when a negative ESD stress is applied to the first power rail V1, the voltage drop $V_{SG1}$ is negative and would not turn on the first transistor 231 and the voltage drop $V_{SG2}$ is positive and would turn on the second transistor 233, which conducts a triggering current (i.e., the triggering signal St) to trigger the DSCR device 150. Otherwise, when a negative ESD stress is applied to the to second power rail V2, the voltage drop $V_{SG1}$ is positive and would turn on the first transistor 231, such that the first transistor 231 conducts a triggering current to trigger the DSCR device 150; and at the same time, the voltage drop $V_{SG2}$ is negative and would not turn on the second transistor 233.

Based on the detection signals Sd1, Sd2 (as gate voltages of the first and second transistor 231, 233), the first or second transistor 231, 233 of the triggering circuit 230 would conduct the ESD current (i.e., triggering signal St) to the DSCR device 150 through a common node of the first and second transistors 231, 233. The DSCR device 150 is then enabled to provide a path to discharge the positive ESD stress being applied on one power rail (V1 or V2) to the other power rail (V2 or V1). In detail, the transistor 155 of DSCR device 150 would be turned on in response to the triggering signal St. Then, the conduction of the transistor 155 would turn on the transistors 151, 153, which forms a path directing the ESD stress from one power rail to the other power rail through the transistors 151, 153, 155.

The disclosure provides effective way to detect the ESD stresses which symmetrically triggers the DSCR device to discharge the ESD stresses from the first power rail to the second power rail, or from the second power rail to the first power rail. The embodiment described above may be implemented in nanoscale manufactured ICs and achieve good ESD robustness while maintaining low standby leakage current and relatively small silicon footprint.

Figure 2B:
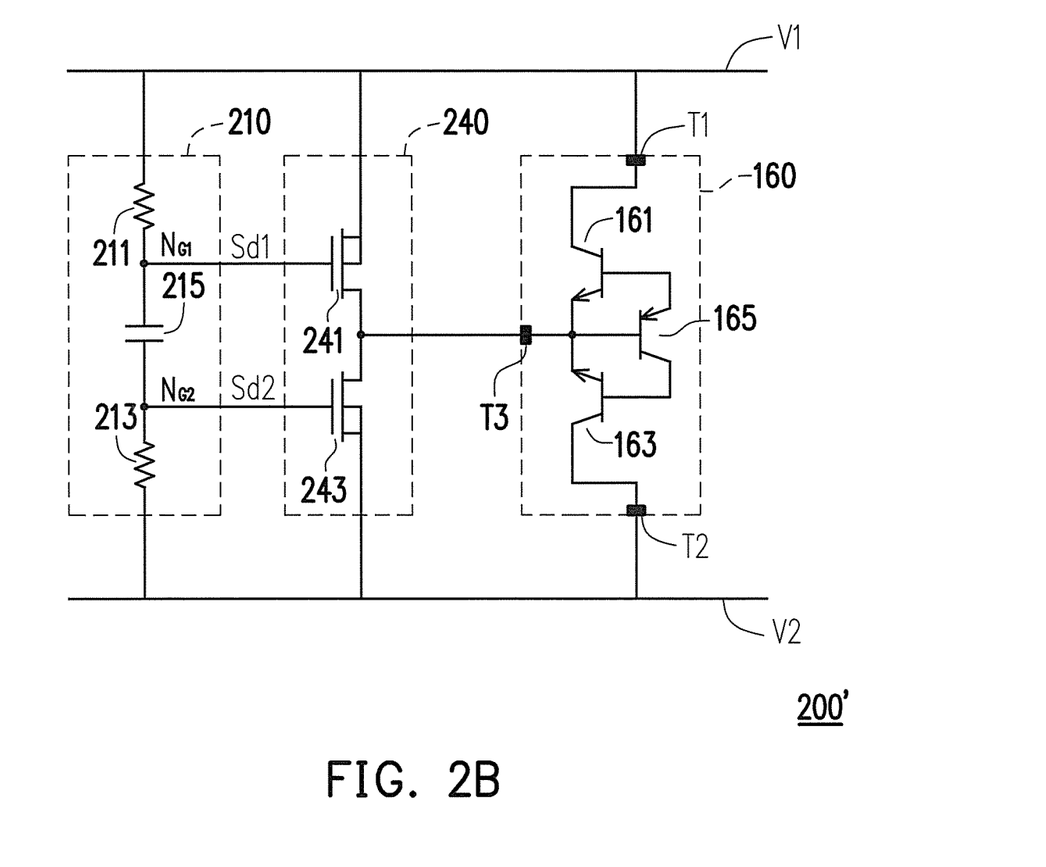
FIG. 2B is an equivalent circuit diagram illustrating an ESD protection circuit according to one of the embodiments of the disclosure.

FIG. 2B is an equivalent circuit diagram illustrating an ESD protection circuit 200' according to one of the embodiments of the disclosure. With reference to FIG. 2B, an ESD protection circuit 200' includes the detection circuit 210, a triggering circuit 240, and a DSCR device 160. In the present embodiment, the DSCR device 160 is a P-well based DSCR (pDSCR) device instead, which includes two NPN BJTs and one PNP BJT, and the emitters of the two NPN BJTs are connected together forming the triggering node. To trigger the pDSCR device 160, the triggering circuit 240 includes two n-type transistors 241 and 243 (e.g., NMOS transistors) instead, similar to the role of the p-type transistors 231 and 233 illustrated in FIG. 2A, wherein source terminals of the transistors 241 and 243 are respectively coupled to the power rails V1 and V2, and drain terminals of the transistors 241 and 243 are commonly coupled to the triggering node. In the normal circuit operation, the detection circuit 210 of the ESD protection circuit 200' would keep the transistors of the triggering circuit 240 off, and no triggering current is provided to the triggering node of the DSCR device 160.

In the case of positive ESD stress, when a positive ESD stress is applied to the first power rail V1, the voltage drop $V_{GS1}$ is negative and would not turn on the transistor 241, and the voltage drop $V_{GS2}$ is positive and would turn on the transistor 243, which conducts a triggering current (i.e., the triggering signal St) to trigger the DSCR device 160. Otherwise, when a positive ESD stress is applied to the second power rail V2, the voltage drop $V_{GS1}$ is positive and would turn on the transistor 241, such that the transistor 241 conducts a triggering current to trigger the DSCR device 160; and at the same time, the voltage drop $V_{GS2}$ is negative and would not turn on the second transistor 243.

In the case of negative ESD stress, when a negative ESD stress is applied to the first power rail V1, the voltage drop $V_{GS1}$ is positive and would turn on the transistor 241, which conducts a triggering current (i.e., the triggering signal St) to trigger the DSCR device 160, and at the same time, the voltage drop $V_{GS2}$ is negative and would not turn on the transistor 243. Otherwise, when a negative ESD stress is applied to the second power rail V2, the voltage drop $V_{GS1}$ is negative and would not turn on the transistor 241, and the voltage drop $V_{GS2}$ is positive and would turn on the second transistor 243, which conducts a triggering current to trigger the DSCR device 160.

Figure 3:
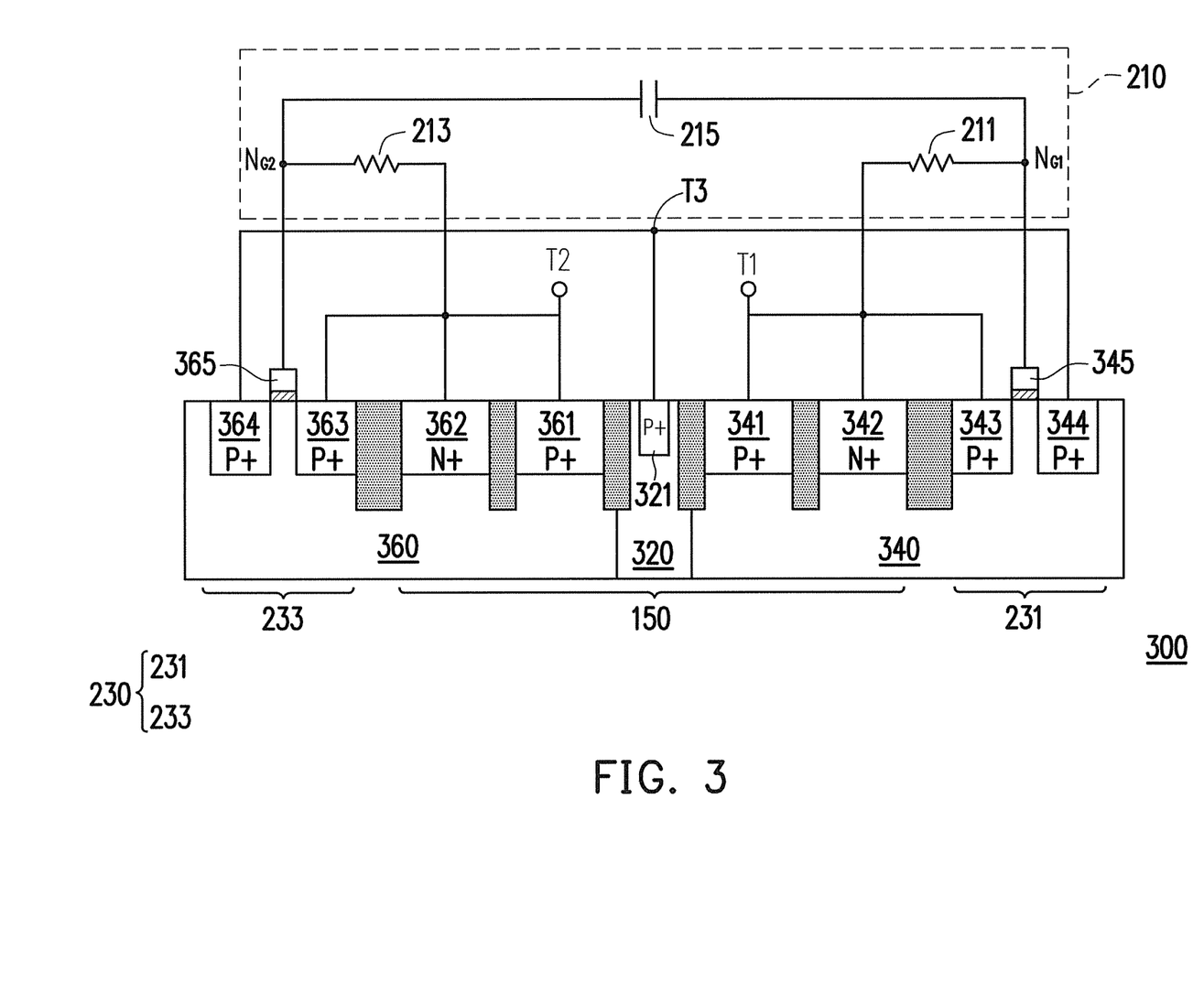
FIG. 3 is a cross-sectional diagram illustrating a structure layout of an ESD protection circuit according to one of the embodiments of the disclosure.

In the following, the disclosure would be described in term of structure. FIG. 3 is a cross-sectional diagram illustrating a structure layout of an ESD protection circuit 300 according to one of the embodiments of the disclosure. The ESD protection circuit 300 is similar to the ESD protection circuit 200 of FIG. 2A and includes the detection circuit 210, the triggering circuit 230, and the DSCR device 150.

With reference to FIG. 3, the N-well based DSCR (nDSCR) device 150 is implemented with embedded p-type transistors of the triggering circuit 230, and includes a P-type well region 320, a first N-type well region 340, and a second N-type well region 360. In the embodiment, the first N-type well region 340 includes a first P+-type doped region 341, a first N+-type doped region 342, a second P+-type doped region 343, and a third P+-type doped region 344. In addition, the second N-type well region 360 includes a fourth P+-type doped region 361, a second N+-type doped region 362, a fifth P+-type doped region 363, and a sixth P+-type doped region 364.

As mentioned above, the DSCR device 150 may be implemented by N-well based or P-well based DSCR (nDSCR or pDSCR). Similarly, the transistors of the triggering circuit may be implemented by n-type or p-type transistors. Therefore, the doping type of the wells and doping regions specified here (e.g., N-type, P-type, N+-type, P+-type, etc.) are to make the disclosure more comprehensible, however, it is not intended to limit the disclosure. The doping type of the regions are based on the type of the DSCR.

The DSCR device 150 includes a first transistor 151, a second transistor 153, and a third transistor 155. With reference to FIG. 3, the first transistor 151 is formed by the first P+-type doped region 341, the first N-type well region 340 and the P-type well region 320. The P+ doped region 341 is a contact region acting as the first terminal (emitter) of the first transistor 151, the N+ doped region 342 is a contact region acting as the base terminal of the first transistor 151, and the P+ doped region 321 is a contact region acting as the second terminal (collector) of the first transistor 151.

The second transistor 153 is formed by the fourth P+-type doped region 361, the second N-type well region 360, and the P-type well region 320. The P+ doped region 361 is a contact region acting as the first terminal (emitter) of the second transistor 153, the N+ doped region 362 is a contact region acting as the based terminal of the second transistor 153, and the P+ doped region 321 is a contact region acting as the second terminal (collector) of the second transistor 153.

The third transistor 155 is formed by the first N-type well region 340, the P-type well region 320, and the second N-type well region 360. The N+ doped region 342 is a contact region acting as the first terminal (emitter or collector) of the third transistor 155, the P+ doped region 321 is a contact region acting as the base terminal of the third transistor 155, and the N+ doped region 362 is a contact region acting as the second terminal (emitter or collector) of the third transistor 155.

In one of the embodiments of the disclosure, the first and second transistors 231, 233 of the triggering circuit 230 may be implemented on the same substrate as the DSCR device 150. With reference to FIG. 3, the first transistor 231 is disposed on the right side of the DSCR device 150, and the second transistor 233 is disposed on the left side of the DSCR device 150. In the embodiment, a first gate region 345 is disposed on the first N-type well region 340 to act as a control terminal of the first transistor 231, and a second gate region 365 is disposed on the second N-type well region 360 to act as a control terminal of the second transistor 233. The first transistor 231 is formed by the second P+-type doped region 343, the first gate region 345, and the third P+-type doped region 344 in the first N-type well region 340. The second transistor 233 is formed by the fifth P+-type doped region 363, the second gate region 365, and the sixth P+-type doped region 364. It should be noted that the first transistor 231 and the second transistor 233 have different body terminals.

Figure 4:
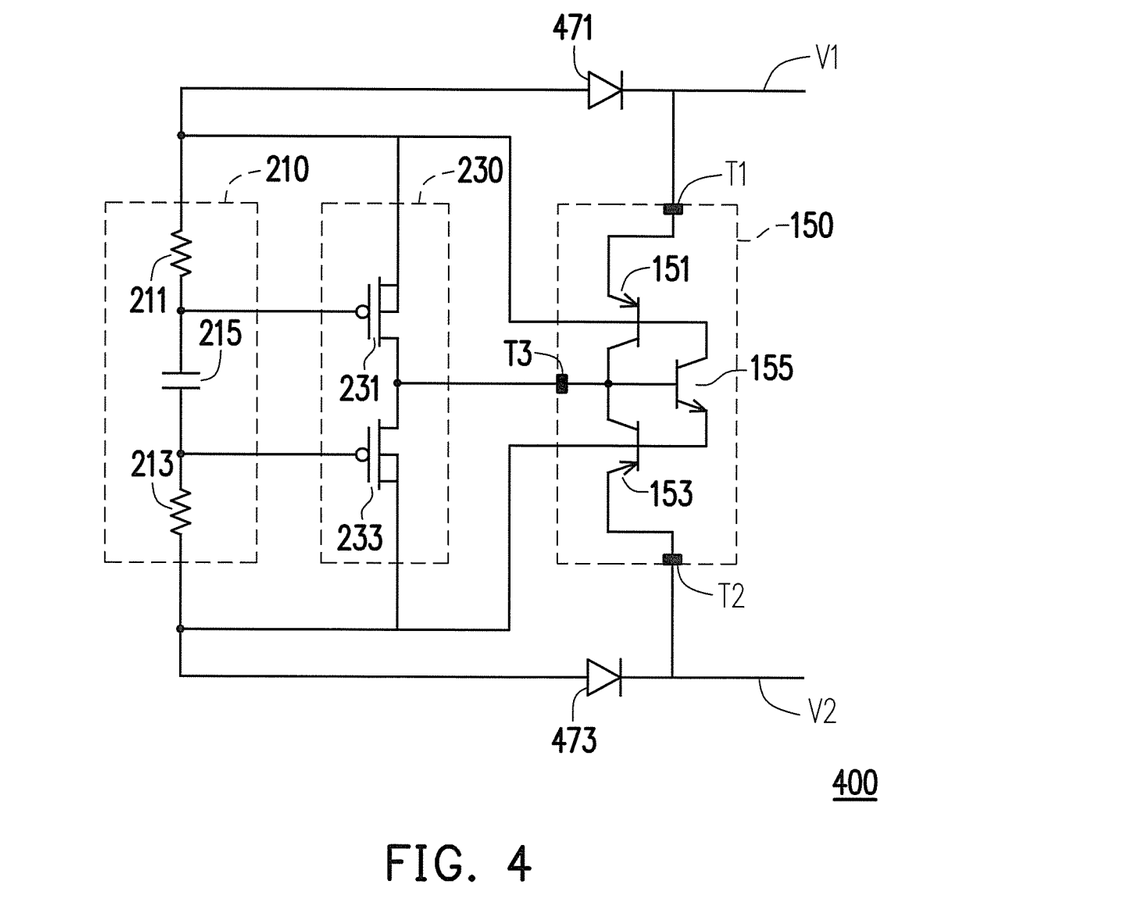
FIG. 4 is an equivalent circuit diagram illustrating an ESD protection circuit according to one of the embodiments of the disclosure.

In the disclosure, the turn-on speed of a DSCR device may be further enhanced. FIG. 4 is an equivalent circuit diagram illustrating an ESD protection circuit 400 according to one of the embodiments of the disclosure. The operation of the ESD protection circuit 400 is similar to the ESD protection circuit 200 illustrated in FIG. 2. The difference lies within the addition of a first diode 471 and a second diode 473. In detail, a cathode terminal of the first diode 471 is coupled to the first power rail V1 and a first terminal T1 of the DSCR device 150, and an anode terminal of the first diode 471 is connected to the detection circuit 210 and the triggering circuit 230; a cathode terminal of the second diode 473 is coupled to the second power rail V2 and a second terminal T2 of the DSCR device 150, and an anode terminal of the second diode 473 is connected to the detection circuit 210 and the triggering circuit 230. The base terminal of the first transistor 151 is coupled to the resistor 211 and the first terminal of the first transistor 231, and the base terminal of the second transistor 153 is coupled to the resistor 213 and the first terminal of the second transistor 233.

Figure 5:
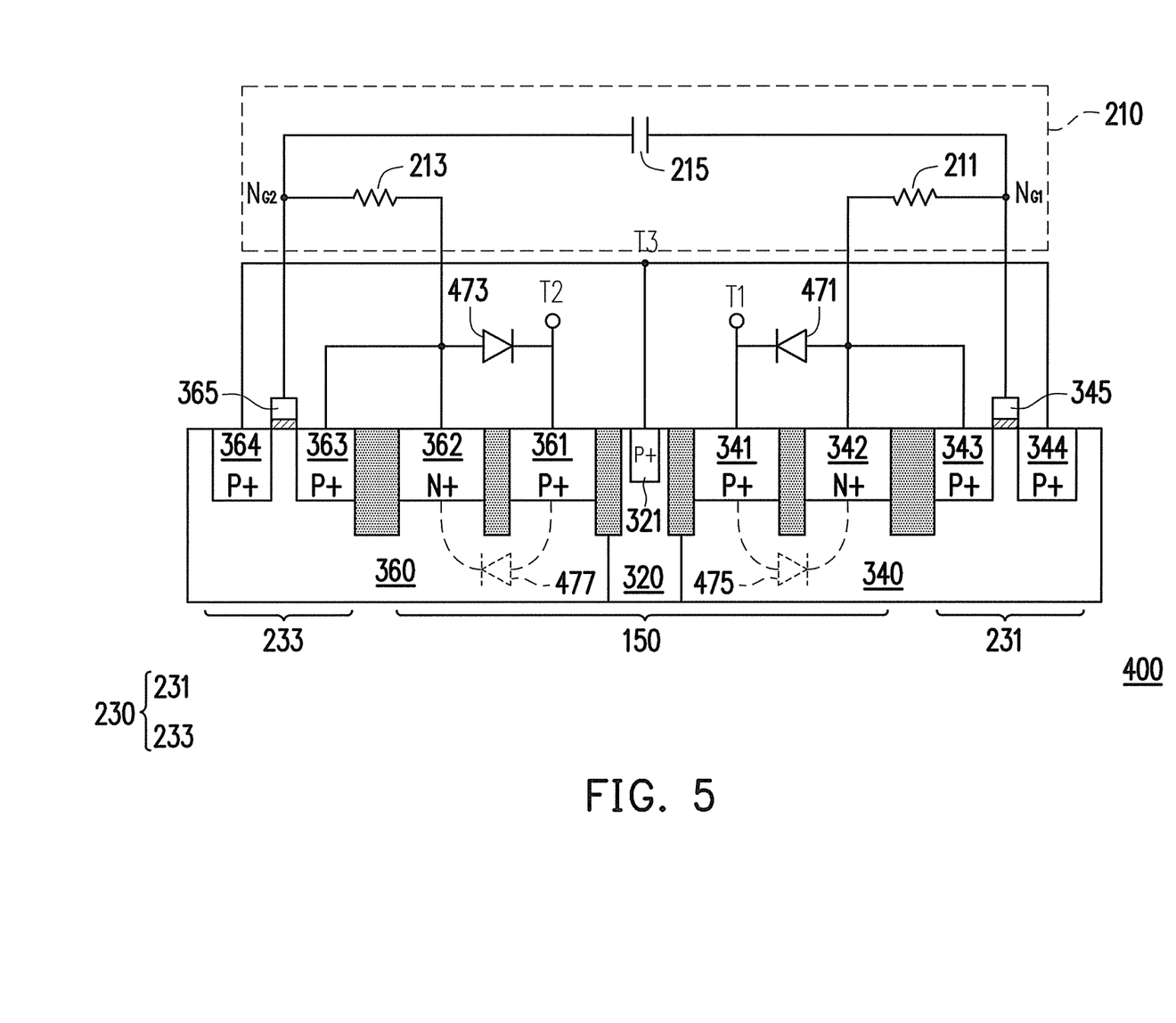
FIG. 5 is a cross sectional diagram illustrating an ESD protection circuit according to one of the embodiments of the disclosure.

FIG. 5 is a cross sectional diagram illustrating the ESD protection circuit 400 of FIG. 4. With reference to FIG. 5, a pn junction of the first transistor 151, denoted as a parasitic diode 475, is formed between the P+-type doped region 341 and the N+-type doped region 342, and also a pn junction of the second transistor 153, denoted as a parasitic diode 477, is formed between the P+-type doped region 361 and the N+-type doped region 362. When a positive ESD stress is introduced on the first power rail V1, an ESD current would flow through the parasitic diode 471, the parasitic diode 475, the detection circuit 210 (the resistor 211, the capacitor 215, the resistor 213) then to the second power rail V2. The ESD current cause a voltage drop across the first resistor 211, which turns on the first transistor 231 of the triggering circuit 230. Then, the ESD current flows, from the first power rail V1, through the intrinsic parasitic diode 475, the first transistor 231, and into the triggering node (T3), acting as the triggering signal St, and flows through the base-emitter junction of the third transistor 155, the parasitic diode 477, and to the second power rail V2. The described ESD current path would cause all of the parasitic bipolar transistors to effectively turn on at the same time, and thus improving the turn on speed of the DSCR device 150. When a positive ESD stress is introduced on the second power rail V2, similar behavior can be derived based on the description above and thus it is not being repeated.

Figure 6:
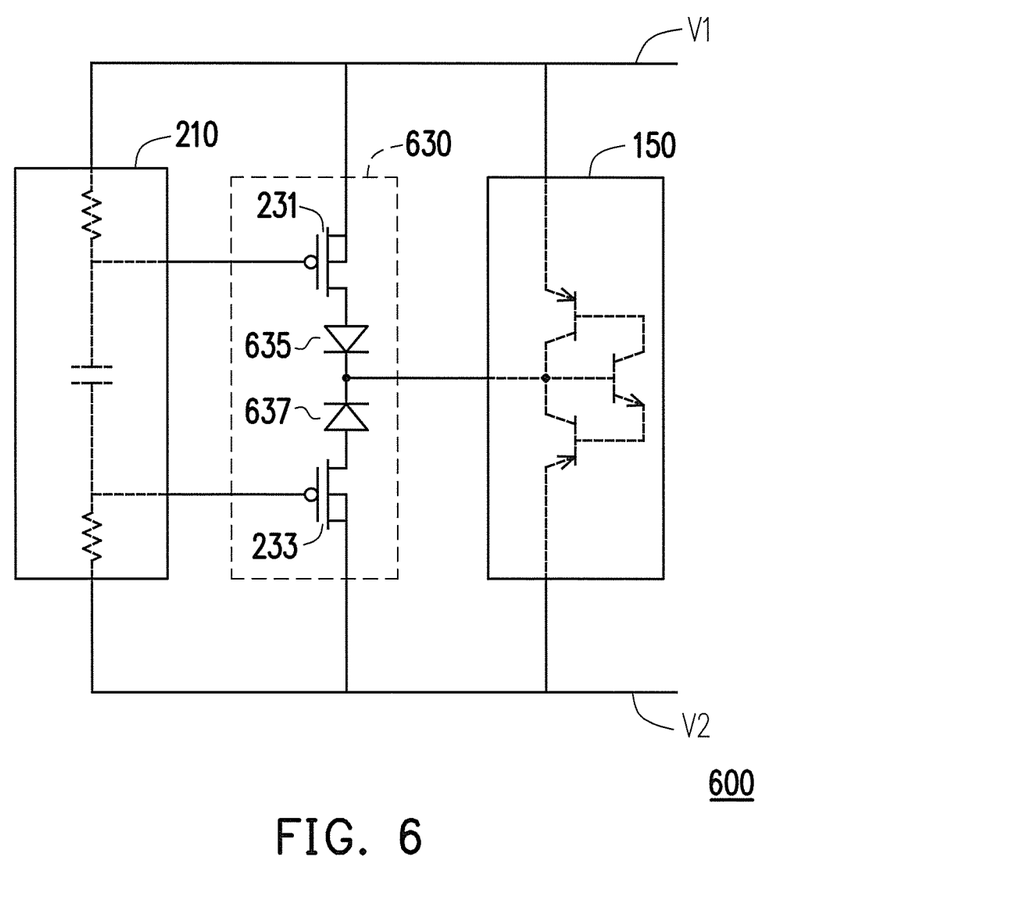
FIG. 6 is a circuit diagram illustrating an ESD protection circuit according to one of the embodiments of the disclosure.

FIG. 6 is a circuit diagram illustrating an ESD protection circuit 600 according to one of the embodiments of the disclosure. For the description and operation of the detection circuit 210 and the DSCR device 150, please refer to the description of FIG. 2A. In the embodiment, in addition to the first and second transistors 231, 233, a triggering circuit 630 further includes a diode 635 and a diode 637 to minimize any leakage current from the transistors 231, 233 due to the gate leakage effect or junction leakage.

In detail, the anode of the diode 635 is connected to the second terminal of the p-type transistor 231, and the cathode of the diode 635 is connected to the triggering node. The anode of the diode 637 is connected to the second terminal of the p-type transistor 233, and the cathode of the diode 637 is connected to the triggering node. In another embodiment using a pDSCR device such as the DSCR device 160 of FIG. 2B, a triggering circuit modified based on the triggering circuit 240 of FIG. 2B may also include a first diode and a second diode to minimize any leakage current. In this case, the cathode of the first diode is connected to the second terminal of the n-type transistor 241, and the anode of the first diode is connected to the triggering node; the cathode of the second diode is connected to the second terminal of the n-type transistor 243, and the anode of the second diode is connected to the triggering node. In another embodiment, one of the diode 635 and the diode 637 may be removed and the function of minimizing leakage current may still exist for only one direction. In still another embodiment, a diode string (i.e., more than one diode) may be coupled between a transistor of the triggering circuit and the triggering node.

Figure 7:
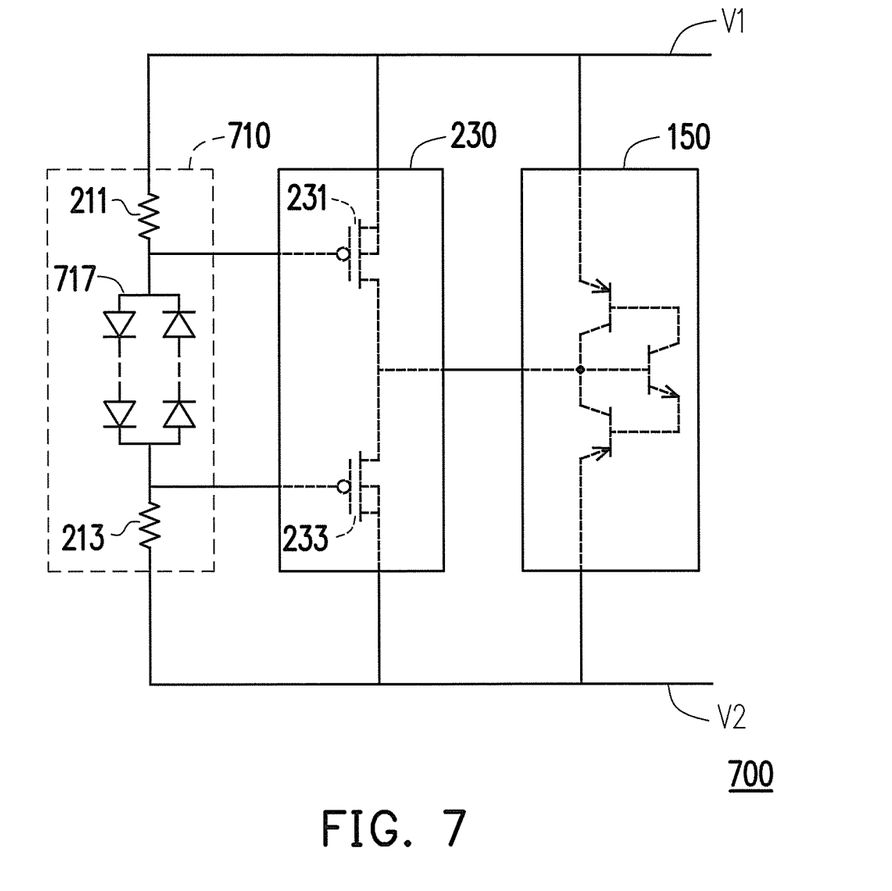
FIG. 7 is a circuit diagram illustrating an ESD protection circuit according to one of the embodiments of the disclosure.

FIG. 7 is a circuit diagram illustrating an ESD protection circuit 700 according to one of the embodiments of the disclosure. For the description and operation of the triggering circuit 230 and the DSCR device 150, please refer to the description of FIGS. 1 and 2A. In the embodiment, the capacitor 215 illustrated in FIGS. 2A or 2B may be replaced by a plurality of diode strings 717, and the resistors 211, 213 and the diode strings 717 form a RDR (resistor-diode-resistor) network. The diode strings 717 may be connected in antiparallel manner. Similar to the capacitor 215, the diode strings 717 may be coupled to the first power rail V1 through the first resistor 211 and coupled to the second power rail V2 through the second resistor 213. The number of the diodes in each string may be determined according to the maximum voltages between the first and second power rails V1, V2 during normal circuit operation. Under normal circuit operation, the voltage applied between the first and second power rails V1, V2 will be smaller than a turn-on voltage of a diode string (and the other diode string is reverse-biased), so there would be no current flowing through the resistors 211 and 213, thus the transistor 231 and 233 of the triggering circuit would be turned off. When the ESD stress is applied to the first or second power rail V1, V2 and the ESD voltage is high enough, one of the diode strings is turned on and causes voltage drops across the resistors 211 and 213. Similar to the RCR network described in FIG. 2, the voltage drops across the resistors 211 and 213 would turn on one of the first and second transistors 231 and 233 to trigger the DSCR device 150.

In view of aforementioned description, the disclosure provides an ESD protection circuit coupled between a first power rail or a second power rail, which effectively discharges any ESD stress occurred on the first or second power rail. The ESD protection circuit utilizes a dual silicon controlled rectifier (DSCR) device with a triggering circuit that symmetrically triggers the DSCR device in response to polarities of the ESD stress. The exemplary ESD protection circuit may be implemented in nanoscale manufactured integrated circuit and achieve good ESD robustness while maintaining low standby leakage current and relatively small silicon footprint.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An electrostatic discharge (ESD) protection circuit, comprising:
    a detection circuit, coupled between a first power rail and a second power rail, detecting an ESD stress from the first power rail or the second power rail, and outputting a detection signal according to the ESD stress;
    a triggering circuit, coupled to the detection circuit, receiving the detection signal and outputting a triggering signal according to the detection signal; and
    a dual-directional silicon controlled rectifier (DSCR) device, comprising a first terminal coupled to the first power rail, a second terminal coupled to the second power rail, a third terminal coupled to the triggering circuit to receive the triggering signal, and at least two transistors of a first type, and configured to discharge the ESD stress according to the triggering signal, wherein the third terminal is coupled to a common node between at least two transistors of the first type.

2. The ESD protection circuit of claim 1, wherein the at least two transistors of the first type comprise:
    a first transistor of the first type, having a base terminal, a first terminal coupled to the first terminal of the DSCR device, and a second terminal; and
    a second transistor of the first type, having a base terminal, a first terminal coupled to the second terminal of the DSCR device, and a second terminal coupled to the second terminal of the first transistor of the first type, wherein the common node is formed by the second terminal of the first transistor of the first type and the second terminal of the second transistor of the first type.

3. The ESD protection circuit of claim 2, wherein the DSCR device further comprises:
    a third transistor of a second type, having a base terminal coupled to the common node, a first terminal coupled to the base terminal of the second transistor of the first type, and a second terminal coupled to the base of the first transistor of the first type.

4. The ESD protection circuit of claim 3, wherein the first transistor is formed by a first region of a second doping type disposed in a first well of a first doping type, the first well of the first doping type, and a third well of the second doping type,
    wherein the second transistor is formed by a second region of the second doping type disposed in a second well of the first doping type, the second well of the first doping type, and the third well of the second doping type, and
    wherein the third transistor is formed by the first well of the first doping type, the third well of the second doping type disposed between the first well of the first doping type and the second well of the first doping type, and the second well of the first doping type, wherein the common node of the first transistor, the second transistor and the third transistor is formed by the third well.

5. The ESD protection circuit of claim 1, wherein the triggering circuit comprises:
    a fourth transistor having a first terminal coupled to the first power rail, a second terminal coupled to the third terminal of the DSCR device, and a control terminal coupled to the detection circuit; and
    a fifth transistor, having a first terminal coupled to the second power rail, a second terminal coupled to the second terminal of the fourth transistor, and a control terminal coupled to the detection circuit.

6. The ESD protection circuit of claim 5, wherein the triggering circuit further comprises at least one of:
    a first diode coupled between the second terminal of the fourth transistor and the third terminal of the DSCR device; and
    a second diode coupled between the first terminal of the fifth transistor and the third terminal of the DSCR device.

7. The ESD protection circuit of claim 5, wherein the detection circuit comprises:
    a first resistor, coupled between the first power rail and the control terminal of the fourth transistor of the triggering circuit;
    a second resistor, coupled between the second power rail and the control terminal of the fifth transistor of the triggering circuit;
    a first capacitor, coupled between the first resistor and the second resistor.

8. The ESD protection circuit of claim 5, wherein the detection circuit comprises:
    a first resistor, coupled between the first power rail and the control terminal of the fourth transistor of the triggering circuit;
    a second resistor, coupled between the second power rail and the control terminal of the fifth transistor of the triggering circuit;
    an anti-parallel diode string, coupled between the first resistor and the second resistor.

9. The ESD protection circuit of claim 1, further comprising:
    a third diode, coupled between the first power rail and the detection circuit; and
    a fourth diode, coupled between the second power rail and the detection circuit.

10. The ESD protection circuit of claim 1, wherein the DSCR device comprises:
    a first well of a first doping type, having a first doped region of a second doping type;
    a second well of the first doping type, having a second doped region of the second doping type;
    a third well of the second doping type, disposed between the first well of the first doping type and the second well of the first doping type, and having a third doped region of the second doping type with higher doping concentration,
    wherein the first doped region of the second doping type is coupled to one of the first terminal and the second terminal of the DSCR device, the second doped region is coupled to another one of the first terminal and the second terminal of the DSCR device, and the third doped region is coupled to the third terminal of the DSCR device.

11. An electrostatic discharge (ESD) protection circuit, coupled between a first power rail and a second power rail, comprising:
   a switch circuit, outputting a triggering signal in response to an ESD stress from the first power rail or the second power rail;
   a first transistor of a first type and a second transistor of the first type connected in series between the first power rail and the second power rail, wherein a common node commonly jointed by first transistor and the second transistor is coupled to the switch circuit for receiving the triggering signal.

12. The ESD protection circuit of claim 11, further comprising:
   a third transistor of a second type, having a base terminal coupled to the common node of the first and the second transistors, a first terminal and a second terminal respectively coupled to a base terminal of each of the first and the second transistors.

13. The ESD protection circuit of claim 11, wherein the first transistor of the first type has the base terminal, a first terminal coupled to the first power rail, and a second terminal coupled to the switch circuit; and
   the second transistor of the first type has the base terminal, a first terminal coupled to the second power rail, and a second terminal coupled the switch circuit.

14. The ESD protection circuit of claim 11, wherein the switch circuit comprises:
   a first resistor, coupled to the first power rail;
   a second resistor, coupled to the second power rail;
   a capacitor, coupled between the first resistor and the second resistor;
   a fourth transistor, having a control terminal, a first terminal and a second terminal, the control terminal being coupled to a first node commonly jointed by the first resistor and the capacitor, the first terminal being coupled to the first power rail, and the second terminal coupled to the common node; and
   a fifth transistor, having a control terminal, a first terminal and a second terminal, the control terminal being coupled to a third node commonly jointed by the second resistor and the capacitor, the first terminal being coupled to the second power rail, and the second terminal being coupled to the common node.

* * * * *